(12) United States Patent
Wan et al.

(10) Patent No.: US 10,443,960 B2
(45) Date of Patent: Oct. 15, 2019

(54) PHASE CHANGE MATERIAL EVAPORATOR AND HEAT DISSIPATING APPARATUS USING THE SAME

(71) Applicant: Man Zai Industrial Co., Ltd., Tainan (TW)

(72) Inventors: Cheng-Chien Wan, Tainan (TW); Cheng-Feng Wan, Tainan (TW); Hao-Hui Lin, Tainan (TW); Tung-Hsin Liu, Tainan (TW); Wei-Che Hsiao, Tainan (TW); Hsiao-Ching Chen, Tainan (TW); Dhao-Jung Lin, Tainan (TW)

(73) Assignee: Man Zai Industrial Co., Ltd., Tainan (TW)

( * ) Notice: Subject to any disclaimer, the term of this patent is extended or adjusted under 35 U.S.C. 154(b) by 236 days.

(21) Appl. No.: 15/794,248

(22) Filed: Oct. 26, 2017

(65) Prior Publication Data
US 2019/0041144 A1 Feb. 7, 2019

(30) Foreign Application Priority Data
Aug. 2, 2017 (TW) .............................. 106126014 A

(51) Int. Cl.
*F28F 13/08* (2006.01)
*F28D 15/02* (2006.01)
(Continued)

(52) U.S. Cl.
CPC .......... *F28F 13/08* (2013.01); *F28D 15/0266* (2013.01); *F28F 3/025* (2013.01);
(Continued)

(58) Field of Classification Search
USPC ........................................ 165/104.21, 104.19
See application file for complete search history.

(56) References Cited

U.S. PATENT DOCUMENTS

| 4,485,429 A | * | 11/1984 | Mittal | ..................... F28F 3/022 165/104.33 |
| 5,436,796 A | * | 7/1995 | Abe | ....................... H01G 9/025 361/525 |

(Continued)

*Primary Examiner* — Justin M Jonaitis
(74) *Attorney, Agent, or Firm* — C. G. Mersereau; DeWitt LLP

(57) ABSTRACT

A heat dissipating apparatus has a phase change material evaporator, a condenser, a refrigerant output tube, and a refrigerant input tube. The evaporator has a base having an evaporation chamber, a refrigerant inlet and a refrigerant outlet, a reinforcement panel mounted in the evaporation chamber and dividing the evaporation chamber into two spaces, and multiple heat conduction fins separately arranged in the two spaces. An opening area of the refrigerant outlet is larger than an opening area of the refrigerant inlet. The evaporator, the refrigerant output tube, the condenser and the refrigerant input tube form a closed refrigerant circulation loop with a refrigerant filled therein. Gas pressure of a gas-phased refrigerant in the two spaces can be increased. With pressure difference between the refrigerant outlet and the refrigerant inlet, the gas-phased refrigerant can be accelerated to flow toward the refrigerant outlet and flowability of the refrigerant can be increased.

20 Claims, 7 Drawing Sheets

(51) Int. Cl.
  *F28F 3/02* (2006.01)
  *H05K 7/20* (2006.01)
  *H01L 23/427* (2006.01)
  *F28D 21/00* (2006.01)
  *H01L 23/367* (2006.01)

(52) U.S. Cl.
  CPC ............ *H01L 23/427* (2013.01); *H05K 7/20* (2013.01); *F28D 2021/0028* (2013.01); *F28F 2225/00* (2013.01); *H01L 23/3672* (2013.01)

(56) References Cited

U.S. PATENT DOCUMENTS

| | | | | |
|---|---|---|---|---|
| 6,942,018 | B2* | 9/2005 | Goodson | F04B 19/006 |
| | | | | 165/104.21 |
| 7,404,433 | B1* | 7/2008 | Hu | H01L 23/473 |
| | | | | 165/104.33 |
| 2005/0067155 | A1* | 3/2005 | Thayer | F25B 23/006 |
| | | | | 165/172 |
| 2006/0283579 | A1* | 12/2006 | Ghosh | H01L 23/473 |
| | | | | 165/104.33 |
| 2008/0029260 | A1* | 2/2008 | Hu | F28F 3/027 |
| | | | | 165/182 |
| 2008/0169086 | A1* | 7/2008 | Hu | F28D 1/05366 |
| | | | | 165/80.4 |
| 2009/0040723 | A1* | 2/2009 | Lin | H05K 7/20254 |
| | | | | 361/699 |
| 2016/0223230 | A1* | 8/2016 | Wan | F25B 39/00 |

\* cited by examiner

PHASE CHANGE MATERIAL EVAPORATOR AND HEAT DISSIPATING APPARATUS USING THE SAME

CROSS-REFERENCE TO RELATED APPLICATIONS

This application claims the benefit of Taiwan patent application No. 106126014, filed on Aug. 2, 2017, the disclosure of which is incorporated herein in its entirety by reference.

BACKGROUND OF THE INVENTION

1. Field of the Invention

The present invention relates to a heat dissipating apparatus, especially to a heat dissipating apparatus and an evaporator of the heat dissipating apparatus that absorb and release heat through a refrigerant.

2. Description of the Prior Art(s)

During operation, an electronic device usually generates heat. In order to avoid malfunction or damage of the electronic device when temperature of the electronic device is too high, a heat dissipating apparatus is installed at a heat generating source of the electronic device. The heat dissipating apparatus absorbs heat generated from the heat generating source and quickly conducts the heat to the outside, so as to maintain the temperature of the electronic device at an optimum operating temperature.

Generally, conventional heat dissipating apparatuses that are used for dissipating the heat from electronic device dissipate the heat through phase change materials. The conventional heat dissipating apparatus includes an evaporator, a condenser, and multiple refrigerant tubes. The refrigerant tubes connect the evaporator and the condenser so as to form a closed refrigerant circulation loop. A refrigerant is filled in the closed refrigerant circulation loop. The conventional heat dissipating apparatus conducts the heat generated from the heat generating source via a bottom panel of the evaporator. The refrigerant in the evaporator absorbs the heat and phase of the refrigerant is changed to gas. The gas-phased refrigerant flows through one of the refrigerant tubes to the condenser and dissipates the heat in the condenser. As temperature of the refrigerant is lowered, the phase of the refrigerant is changed to liquid. The liquid-phased refrigerant flows through the other refrigerant tube to the evaporator to absorb the heat again. Thus, the conventional heat dissipating apparatus with circulating heat dissipating function cools the heat generating source of the electronic device.

However, although the aforementioned conventional heat dissipating apparatus dissipates the heat from the heat generating source of the electronic device, an evaporation chamber that is defined inside the evaporator causes structural strength of the evaporator to be low. Moreover, when the bottom panel of the evaporator contacts the heat generating source, the refrigerant that absorbs the heat and with the phase being changed to gas is stored in the spacious single evaporation chamber, which causes it hard to increase pressure of the gas-phased refrigerant. In addition, since radial cross-sectional areas of two refrigerant tubes that are respectively connected to two opposite sides of the evaporator are the same and fluid pressures in the two refrigerant tubes are the same, it is hard to force the gas-phased refrigerant to flow out of the refrigerant chamber. Accordingly, it is hard to allow the refrigerant to flow cyclically.

Although the refrigerant tubes may be disposed one higher than the other so as to guide the gas-phased refrigerant that flows upward to flow out of the evaporation chamber, it is still hard to increase the pressure of the gas-phased refrigerant with structure of the conventional evaporation chamber. Therefore, it is hard to allow the refrigerant to flow cyclically.

To overcome the shortcomings, the present invention provides a phase change material evaporator and a heat dissipating apparatus using the same to mitigate or obviate the aforementioned problems.

SUMMARY OF THE INVENTION

The main objective of the present invention is to provide a phase change material evaporator and a heat dissipating apparatus using the evaporator. The heat dissipating apparatus has the phase change material evaporator, a condenser, a refrigerant output tube, and a refrigerant input tube.

The phase change material evaporator has a base, a reinforcement panel, and multiple heat conduction fins.

The base has a heat conduction panel, an outer casing, and a guiding end portion. The outer casing is securely mounted on the heat conduction panel. An evaporation chamber is defined in the outer casing and is surrounded by the heat conduction panel and the outer casing. The outer casing has a top wall, a peripheral sidewall protruding down from the top wall of the outer casing and attached to the heat conduction panel, a refrigerant inlet formed through the peripheral sidewall of the outer casing and communicating with the evaporation chamber, and an opening formed through the top wall of the outer casing and communicating with the evaporation chamber. The guiding end portion is disposed on the top wall of the outer casing and has a sidewall, a guiding chamber defined in the guiding end portion and communicating with evaporation chamber through the opening, and a refrigerant outlet formed through the sidewall of the guiding end portion and communicating with the guiding chamber. The refrigerant outlet is disposed higher than the refrigerant inlet, and an opening area of the refrigerant outlet is larger than an opening area of the refrigerant inlet.

The reinforcement panel is mounted in the evaporation chamber of the base and is securely attached to the heat conduction panel and the top wall of the outer casing. The reinforcement panel divides the evaporation chamber of the base into two spaces, divides the opening into two passages, and has multiple apertures formed through the reinforcement panel. The two spaces that are divided by the reinforcement panel communicate with each other via the apertures.

The heat conduction fins are mounted in the evaporation chamber of the base and are separately arranged in the two spaces of the evaporation chamber.

The refrigerant output tube is connected with the condenser and the refrigerant outlet of the phase change material evaporator. The refrigerant input tube is connected with the condenser and the refrigerant inlet of the phase change material evaporator. The evaporator, the refrigerant output tube, the condenser and the refrigerant input tube form a closed refrigerant circulation loop with a refrigerant filled therein.

The heat conduction fins form an enlarged heat dissipating surface and enhance the heat dissipating efficiency. Moreover, with the reinforcement panel mounted in the evaporation chamber of the base, a structural strength of the phase change material evaporator is enhanced. In addition, when the phase change material evaporator contacts a heat generating source and phase of the refrigerant is changed to gas, gas pressures in the two spaces of the evaporation chamber can be increased. Furthermore, as the opening area of the refrigerant outlet is larger than the opening area of the refrigerant inlet, gas pressure at the refrigerant outlet is smaller than gas pressure at the refrigerant inlet. Accordingly, the gas-phased refrigerant is accelerated to flow toward the refrigerant outlet and flowability of the refrigerant can be increased.

Other objectives, advantages and novel features of the invention will become more apparent from the following detailed description when taken in conjunction with the accompanying drawings.

DETAILED DESCRIPTION OF THE PREFERRED EMBODIMENTS

With reference to FIGS. 1 to 5, a phase change material evaporator 10 in accordance with the present invention comprises a base 11, a reinforcement panel 12, and multiple heat conduction fins 13, 13A, 13B.

Figure 1:
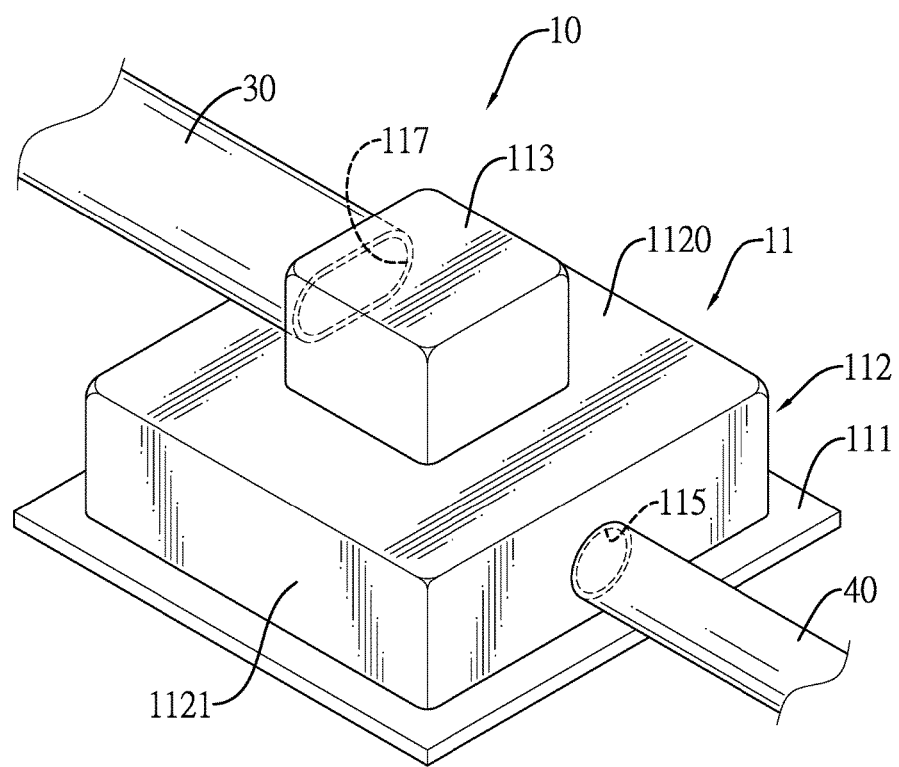
FIG. 1 is a perspective view of a first embodiment of a phase change material evaporator in accordance with the present invention.
Figure 2:
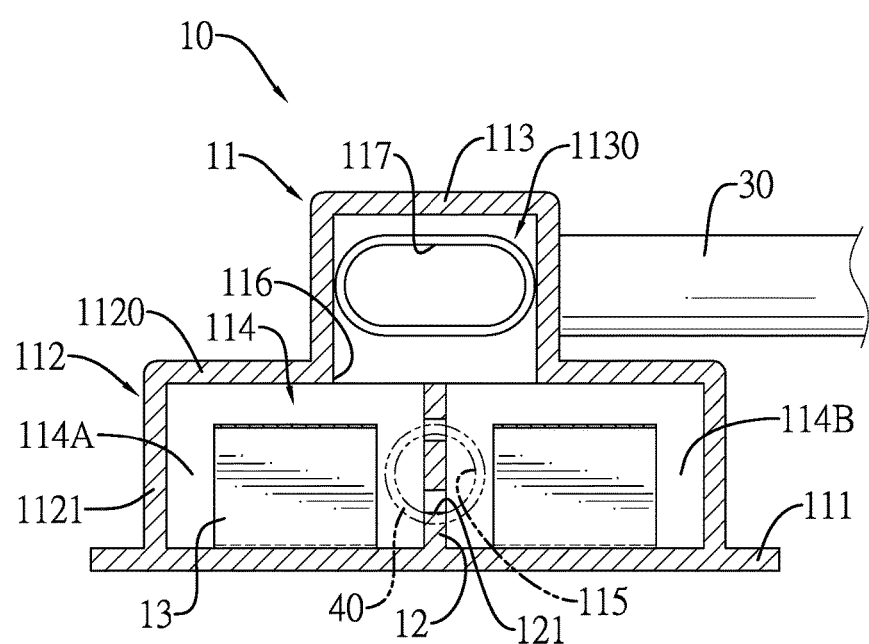
FIG. 2 is a cross-sectional side view of the phase change material evaporator in FIG. 1.
Figure 3:
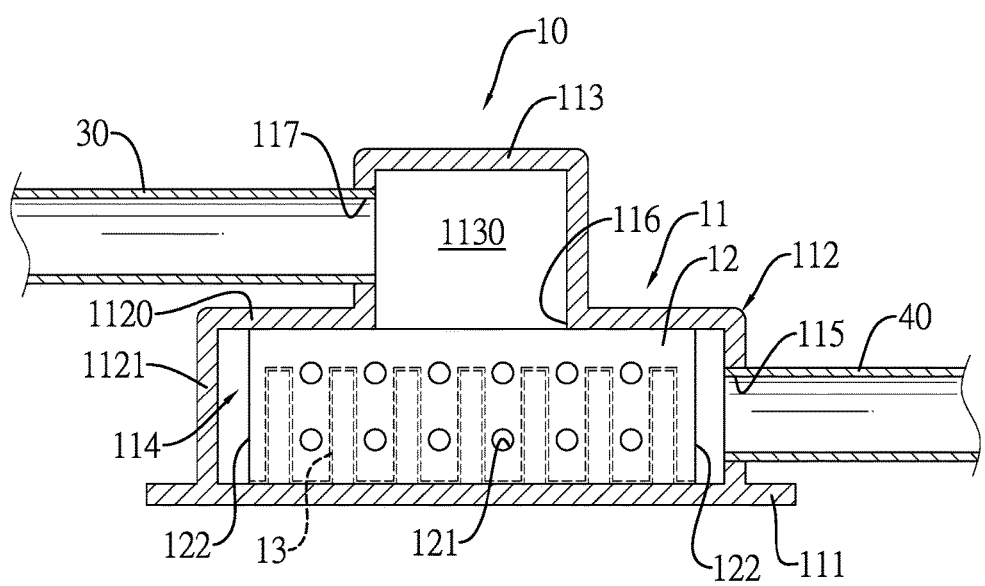
FIG. 3 is another cross-sectional side view of the phase change material evaporator in FIG. 1.

As shown in FIGS. 1 to 3, the base 11 has a heat conduction panel 111, an outer casing 112, and a guiding end portion 113.

The heat conduction panel 111 is made of conductive material.

The outer casing 112 is hollow and is securely mounted on the heat conduction panel 111. An evaporation chamber 114 is defined in the outer casing 112 and is surrounded by the heat conduction panel 111 and the outer casing 112. The outer casing 112 has a top wall 1120, a peripheral sidewall 1121, a refrigerant inlet 115, and an opening 116. The top wall 1120 of the outer casing 112 is disposed opposite to the heat conduction panel 111. The peripheral sidewall 1121 of the outer casing 112 protrudes down from the top wall 1120 of the outer casing 112 and is attached to the heat conduction panel 111. The refrigerant inlet 115 is formed through the peripheral sidewall 1121 of the outer casing 112 and communicates with the evaporation chamber 114. The opening 116 is formed through the top wall 1120 of the outer casing 112 and communicates with the evaporation chamber 114.

The guiding end portion 113 is disposed on the top wall 1120 of the outer casing 12 and has a sidewall, a guiding chamber 1130, and a refrigerant outlet 117. The guiding chamber 1130 is defined in the guiding end portion 113 and communicates with evaporation chamber 114 through the opening 116. The refrigerant outlet 117 is formed through the sidewall of the guiding end portion 113 and communicates with the guiding chamber 1130. The refrigerant outlet 117 is disposed higher than the refrigerant inlet 115. An opening area of the refrigerant outlet 117 is larger than an opening area of the refrigerant inlet 115.

Figure 4:
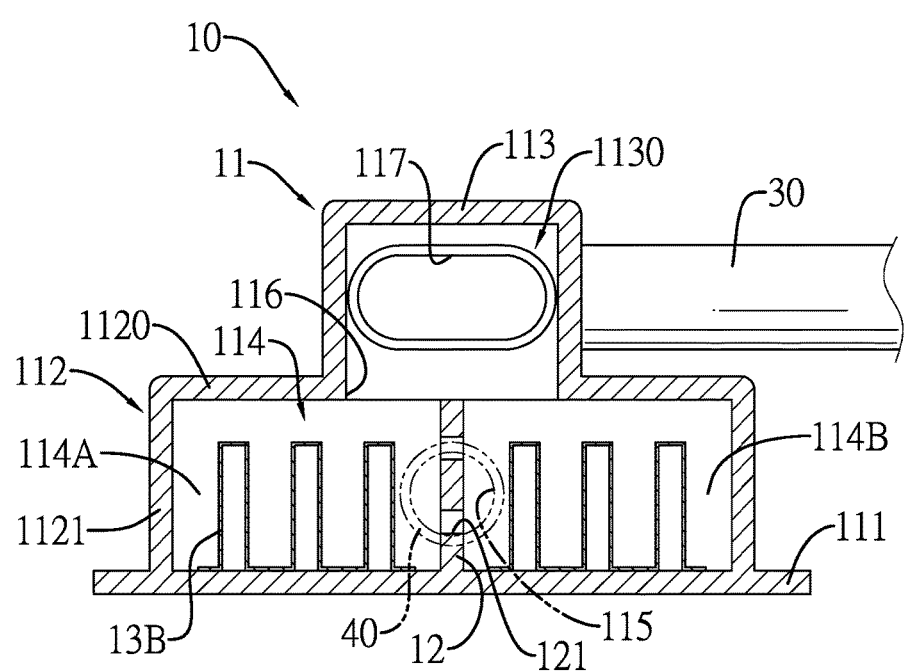
FIG. 4 is a cross-sectional side view of a second embodiment of a phase change material evaporator in accordance with the present invention.
Figure 5:
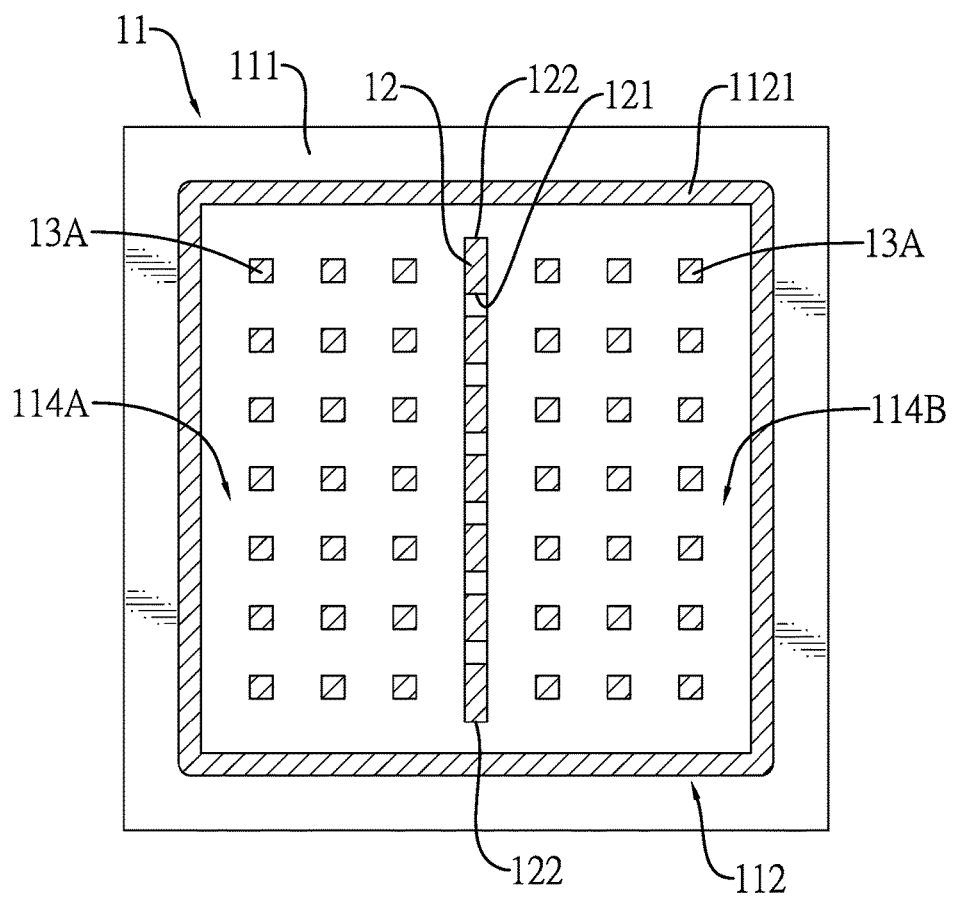
FIG. 5 is a cross-sectional top view of a third embodiment of a phase change material evaporator in accordance with the present invention.

As shown in FIGS. 2 to 5, the reinforcement panel 12 is mounted in the evaporation chamber 114 of the base 11 and is securely attached to the heat conduction panel 111 and the top wall 1120 of the outer casing 112, so as to reinforce a structural strength of the base 11. The reinforcement panel 12 divides the evaporation chamber 114 of the base 11 into two spaces 114A, 114B, divides the opening 116 into two passages, and has an upper edge, two opposite side edges 122, and multiple apertures 121. The upper edge of the reinforcement panel 12 divides the opening 116 into the two passages. The opposite side edges 122 of the reinforcement panel 12 may be attached to the peripheral sidewall 1121 of the outer casing 112; or as shown in FIGS. 3 and 5, the opposite side edges 122 of the reinforcement panel 12 may be spaced out from the peripheral sidewall 1121 of the outer casing 112. The apertures 121 are formed through the reinforcement panel 12. The two spaces 114A, 114B that are divided by the reinforcement panel 12 communicate with each other via the apertures 121.

The refrigerant inlet may be formed as two holes respectively communicating with the two spaces 114A, 114B of the evaporation chamber 114; or as shown in FIGS. 1 to 4, the refrigerant inlet 115 may be formed as a single hole simultaneously communicating with the two spaces 114A, 114B of the evaporation chamber 114.

As shown in FIGS. 2 to 5, the heat conduction fins 13, 13A, 13B are securely mounted in the evaporation chamber 114 of the base 11 and are separately arranged in the two spaces 114A, 114B of the evaporation chamber 114. Each of the heat conduction fins 13, 13A, 13B protrudes up from the heat conduction panel 111 and has an upper end. In the preferred embodiment, the upper end of the heat conduction fin 13, 13A, 13B is spaced out from the top wall 1120 of the outer casing 112.

As shown in FIGS. 2, 3, and 4, the heat conduction fins 13, 13B in each one of the spaces 114A, 114B of the evaporation chamber 114 may be formed by bending a heat conductive metal plate into a corrugated plate. The corrugated plate has multiple crests and multiple troughs. The crests and the troughs are alternately arranged. As shown in FIGS. 2 and 3, an arranging direction of the crests and the troughs may be parallel to the reinforcement panel 12. As shown in FIG. 4, the arranging direction of the crests and the troughs may be perpendicular to the reinforcement panel 12. Otherwise, each of the conductive fins may be formed as a flat plate; or as shown in FIG. 5, each of the conductive fins 13A may be formed as a pin fin.

Figure 6:
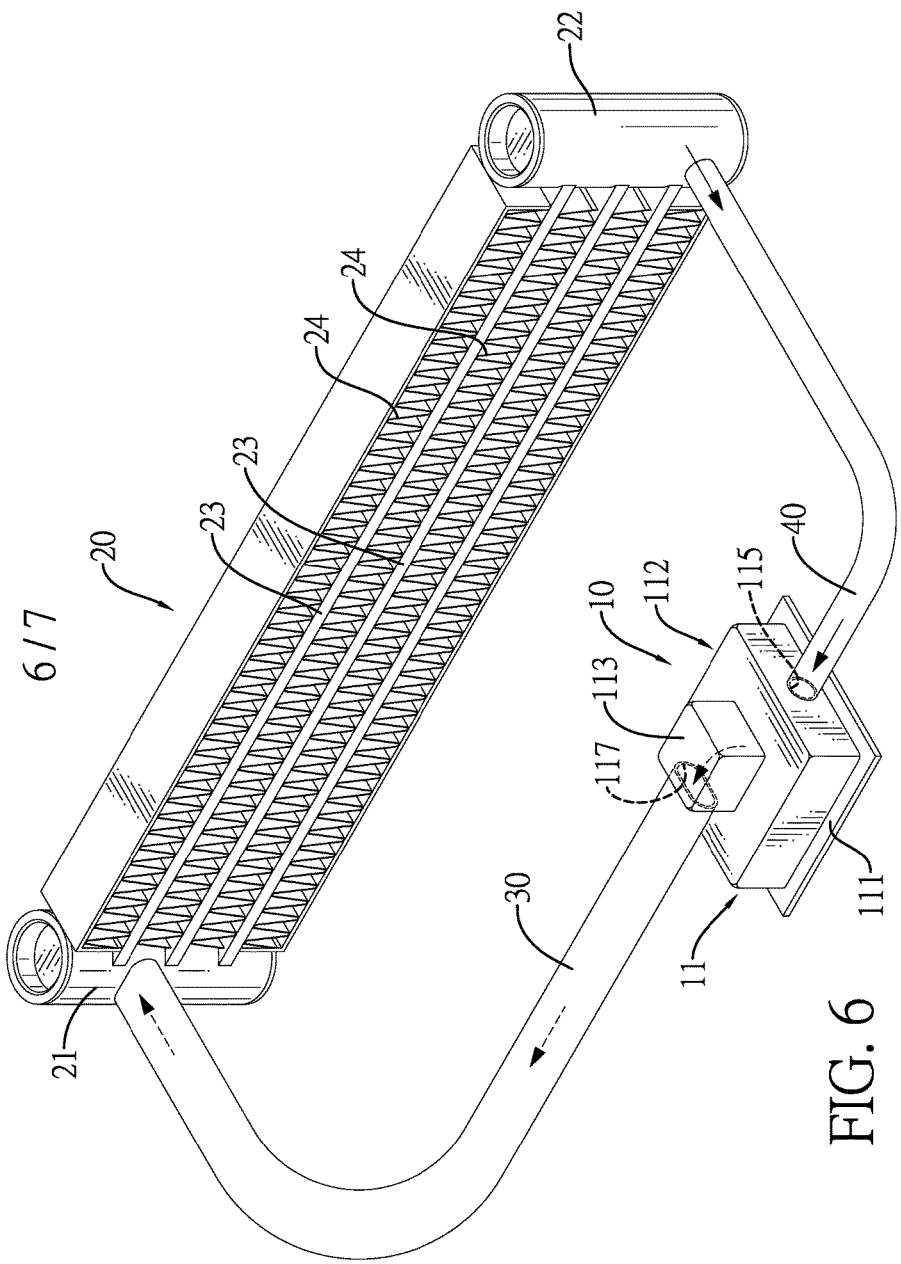
FIG. 6 is a perspective view of a heat dissipating apparatus in accordance with the present invention.

With further reference to FIG. 6, the phase change material evaporator 10 as described is used on heat dissipating apparatus. The heat dissipating apparatus includes the phase change material evaporator 10, a condenser 20, a refrigerant output tube 30, and a refrigerant input tube 40.

The condenser 20 has a first condensing tube 21, a second condensing tube 22, multiple heat dissipating tubes 23, and multiple heat dissipating elements 24. The first condensing tube 21 is uprightly disposed. The second condensing tube 22 is uprightly disposed and is spaced out from the first condensing tube 21. The heat dissipating tubes 23 are disposed between the first condensing tube 21 and the second condensing tube 22 and are separately arranged longitudinally. Each of the heat dissipating tubes 23 has two opposite ends respectively connected with the first condensing tube 21 and the second condensing tube 22. The heat dissipating elements 24 are mounted between each two adjacent heat dissipating tubes 23 and conductively contact with the heat dissipating tubes 23.

The refrigerant output tube 30 has two ends respectively connected with an upper section of the first condensing tube 21 and the refrigerant outlet 117 of the phase change material evaporator 10.

The refrigerant input tube 40 has two ends respectively connected with a lower section of the second condensing tube 21 and the refrigerant inlet 115 of the phase change material evaporator 10.

A radial cross-sectional area of the refrigerant output tube 30 is larger than a radial cross-sectional area of the refrigerant input tube 40. Thus, the phase change material evaporator 10, the refrigerant output tube 30, the condenser 20, and the refrigerant input tube 40 form a closed refrigerant circulation loop and a refrigerant is filled in the closed refrigerant circulation loop.

With reference to FIGS. 2, 4, and 5, when the refrigerant inlet 115 is formed as a single hole and simultaneously communicates with the two spaces 114A, 114B of the evaporation chamber 114, the refrigerant input tube 40 is formed as a single tube connecting to the single hole of the refrigerant inlet 115. Otherwise, when the refrigerant inlet is formed as two holes respectively communicating with the two spaces 114A, 114B of the evaporation chamber 114, the refrigerant input tube is formed as two pipes respectively connecting to the two holes of the refrigerant inlet.

Figure 7:
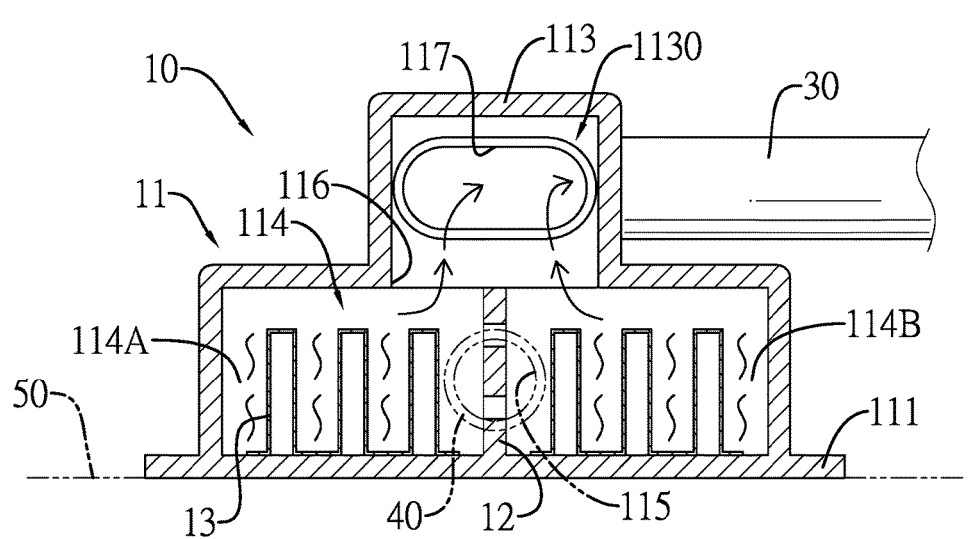
FIG. 7 is an operational cross-sectional side view of the phase change material evaporator in FIG. 4, showing the phase change material evaporator being mounted on a heat generating source.

With further reference to FIGS. 6 and 7, when the heat dissipating apparatus of the present invention is used to cool down an electronic device, the heat conduction panel 111 of the evaporator 10 contacts a heat generating source 50 of the electronic device. Heat generated from the heat generating source 50 is conducted to the heat conduction fins 13 inside the base 11 through the heat conduction panel 111. The heat conduction fins 13 form an enlarged heat dissipating surface. The refrigerant filled in the spaces 114A, 114B of the evaporation chamber 114 of the base 11 absorbs the heat from the heat conduction fins 13 and phase of the refrigerant is changed to gas. The gas-phased refrigerant flows into the guiding chamber 1130 of the guiding end portion 113 via the opening 116 on the top wall 1120 of the base 11, flows through the refrigerant outlet 117 and the refrigerant output tube 30, and then flows into the first condensing tube 21. The gas-phased refrigerant in the first condensing tube 21 flows through the heat dissipating tubes 23 to flow into the second condensing tube 22. When the refrigerant flows through the heat dissipating tubes 23, the heat in the gas-phased refrigerant is conducted to the heat dissipating elements 24. The heat dissipating elements 24 form an enlarged heat dissipating surface to dissipate heat quickly. Accordingly, temperature of the gas-phased refrigerant is lowed and the phase of the refrigerant is changed to fluid. Then the fluid-phased refrigerant flows through the second condensing tube 22, the refrigerant input tube 40, and the refrigerant inlet 115 of the base 11 to flow into the evaporation chamber 114 of the phase change material evaporator to absorb the heat again. With the aforementioned closed refrigerant circulation loop, a heat dissipating efficiency of the heat dissipating apparatus is high.

The phase change material evaporator as described has the following advantages. The heat conduction fins 13, 13A, 13B that are mounted in the evaporation chamber 114 of the phase change material evaporator 10 and protrude up from the heat conduction panel 111 form the enlarged heat dissipating surface and enhance the heat dissipating efficiency. Moreover, with the reinforcement panel 12 mounted in the evaporation chamber 114 of the base 11, a structural strength of the phase change material evaporator 10 is enhanced.

In addition, the reinforcement panel 12 divides the evaporation chamber 114 into the two spaces 114A, 114B and the two spaces 114A, 114B simultaneously communicate with the refrigerant outlet 117. Thus, when the phase change material evaporator contacts the heat generating source 50 and the phase of the refrigerant is changed to gas, gas pressures in the two spaces 114A, 114B of the evaporation chamber 114 can be increased. Furthermore, as the opening area of the refrigerant outlet 117 is larger than the opening area of the refrigerant inlet 115, gas pressure at the refrigerant outlet 117 is smaller than gas pressure at the refrigerant inlet 115. Accordingly, the gas-phased refrigerant is accelerated to flow toward the refrigerant outlet 117 and flowability of the refrigerant can be increased.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A phase change material evaporator comprising:
   a base having
      a heat conduction panel;
      an outer casing securely mounted on the heat conduction panel, wherein an evaporation chamber is defined in the outer casing and is surrounded by the heat conduction panel and the outer casing, and the outer casing having
         a top wall;
         a peripheral sidewall protruding down from the top wall of the outer casing and attached to the heat conduction panel;
         a refrigerant inlet formed through the peripheral sidewall of the outer casing and communicating with the evaporation chamber; and
         an opening formed through the top wall of the outer casing and communicating with the evaporation chamber; and
      a guiding end portion disposed on the top wall of the outer casing and having
         a sidewall;
         a guiding chamber defined in the guiding end portion and communicating with evaporation chamber through the opening; and
         a refrigerant outlet formed through the sidewall of the guiding end portion and communicating with the guiding chamber;
   wherein the refrigerant outlet is disposed higher than the refrigerant inlet, and an opening area of the refrigerant outlet is larger than an opening area of the refrigerant inlet;
   a reinforcement panel mounted in the evaporation chamber of the base and securely attached to the heat conduction panel and the top wall of the outer casing, and the reinforcement panel dividing the evaporation chamber of the base into two spaces, dividing the opening into two passages, and having multiple apertures formed through the reinforcement panel;

wherein the two spaces that are divided by the reinforcement panel communicate with each other via the apertures; and multiple heat conduction fins securely mounted in the evaporation chamber of the base and separately arranged in the two spaces of the evaporation chamber.

2. The phase change material evaporator as claimed in claim 1, wherein each of the heat conduction fins protrudes up from the heat conduction panel and has an upper end spaced out from the top wall of the outer casing.

3. The phase change material evaporator as claimed in claim 2, wherein the heat conduction fins in each one of the spaces of the evaporation chamber is formed by bending a heat conductive metal plate into a corrugated plate.

4. The phase change material evaporator as claimed in claim 3, wherein the corrugated plate has multiple crests and multiple troughs, the crests and the troughs are alternately arranged, and an arranging direction of the crests and the troughs is parallel to the reinforcement panel.

5. The phase change material evaporator as claimed in claim 3, wherein the corrugated plate has multiple crests and multiple troughs, the crests and the troughs are alternately arranged, and an arranging direction of the crests and the troughs is perpendicular to the reinforcement panel.

6. The phase change material evaporator as claimed in claim 2, wherein the reinforcement panel has two opposite side edges is spaced out from the peripheral sidewall of the outer casing.

7. The phase change material evaporator as claimed in claim 3, wherein the reinforcement panel has two opposite side edges is spaced out from the peripheral sidewall of the outer casing.

8. The phase change material evaporator as claimed in claim 4, wherein the reinforcement panel has two opposite side edges is spaced out from the peripheral sidewall of the outer casing.

9. The phase change material evaporator as claimed in claim 5, wherein the reinforcement panel has two opposite side edges is spaced out from the peripheral sidewall of the outer casing.

10. The phase change material evaporator as claimed in claim 1, wherein the refrigerant inlet is formed as a single hole simultaneously communicating with the two spaces of the evaporation chamber.

11. The phase change material evaporator as claimed in claim 2, wherein the refrigerant inlet is formed as a single hole simultaneously communicating with the two spaces of the evaporation chamber.

12. The phase change material evaporator as claimed in claim 3, wherein the refrigerant inlet is formed as a single hole simultaneously communicating with the two spaces of the evaporation chamber.

13. The phase change material evaporator as claimed in claim 1, wherein the refrigerant inlet is formed as two holes respectively communicating with the two spaces of the evaporation chamber.

14. The phase change material evaporator as claimed in claim 2, wherein the refrigerant inlet is formed as two holes respectively communicating with the two spaces of the evaporation chamber.

15. The phase change material evaporator as claimed in claim 3, wherein the refrigerant inlet is formed as two holes respectively communicating with the two spaces of the evaporation chamber.

16. A heat dissipating apparatus including:
a phase change material evaporator comprising
a base having
a heat conduction panel;
an outer casing securely mounted on the heat conduction panel, wherein an evaporation chamber is defined in the outer casing and is surrounded by the heat conduction panel and the outer casing, and the outer casing having
a top wall;
a peripheral sidewall protruding down from the top wall of the outer casing and attached to the heat conduction panel;
a refrigerant inlet formed through the peripheral sidewall of the outer casing and communicating with the evaporation chamber; and
an opening formed through the top wall of the outer casing and communicating with the evaporation chamber; and
a guiding end portion disposed on the top wall of the outer casing and having
a sidewall;
a guiding chamber defined in the guiding end portion and communicating with evaporation chamber through the opening; and
a refrigerant outlet formed through the sidewall of the guiding end portion and communicating with the guiding chamber;
wherein the refrigerant outlet is disposed higher than the refrigerant inlet, and an opening area of the refrigerant outlet is larger than an opening area of the refrigerant inlet;
a reinforcement panel mounted in the evaporation chamber of the base and securely attached to the heat conduction panel and the top wall of the outer casing, and the reinforcement panel dividing the evaporation chamber of the base into two spaces, dividing the opening into two passages, and having multiple apertures formed through the reinforcement panel;
wherein the two spaces that are divided by the reinforcement panel communicate with each other via the apertures; and
multiple heat conduction fins securely mounted in the evaporation chamber of the base and separately arranged in the two spaces of the evaporation chamber;
a condenser having
a first condensing tube uprightly disposed;
a second condensing tube uprightly disposed and spaced out from the first condensing tube;
multiple heat dissipating tubes disposed between the first condensing tube and the second condensing tube and separately arranged longitudinally, and each of the heat dissipating tubes having two opposite ends respectively connected with the first condensing tube and the second condensing tube; and
multiple heat dissipating elements mounted between each two adjacent heat dissipating tubes and conductively contacting with the heat dissipating tubes;
a refrigerant output tube having two ends respectively connected with an upper section of the first condensing tube and the refrigerant outlet of the phase change material evaporator; and
a refrigerant input tube having two ends respectively connected with a lower section of the second condensing tube and the refrigerant inlet of the phase change material evaporator wherein a radial cross-sectional area of the refrigerant output tube is larger than a radial cross-sectional area of the refrigerant input tube;

the phase change material evaporator, the refrigerant output tube, the condenser, and the refrigerant input tube form a closed refrigerant circulation loop; and a refrigerant is filled in the closed refrigerant circulation loop.

17. The heat dissipating apparatus as claimed in claim 16, wherein each of the heat conduction fins protrudes up from the heat conduction panel and has an upper end spaced out from the top wall of the outer casing.

18. The heat dissipating apparatus as claimed in claim 17, wherein the heat conduction fins in each one of the spaces of the evaporation chamber is formed by bending a heat conductive metal plate into a corrugated plate.

19. The heat dissipating apparatus as claimed in claim 16, wherein the refrigerant inlet is formed as a single hole simultaneously communicating with the two spaces of the evaporation chamber; and the refrigerant input tube is formed as a single tube connecting to the single hole of the refrigerant inlet.

20. The heat dissipating apparatus as claimed in claim 16, wherein the refrigerant inlet is formed as two holes respectively communicating with the two spaces of the evaporation chamber; and the refrigerant input tube is formed as two pipes respectively connecting to the two holes of the refrigerant inlet.

* * * * *